United States Patent
Wang et al.

(10) Patent No.: US 12,342,676 B2
(45) Date of Patent: Jun. 24, 2025

(54) ENCAPSULATED FILM AND LUMINESCENT DEVICE INCLUDING LAMINATED BARRIER AND SURFACTANT LAYERS

(71) Applicant: TCL TECHNOLOGY GROUP CORPORATION, Guangdong (CN)

(72) Inventors: Jin Wang, Guangdong (CN); Weiran Cao, Guangdong (CN); Lei Qian, Guangdong (CN)

(73) Assignee: TCL TECHNOLOGY GROUP CORPORATION, Guangdong (CN)

( * ) Notice: Subject to any disclaimer, the term of this patent is extended or adjusted under 35 U.S.C. 154(b) by 887 days.

(21) Appl. No.: 17/419,672

(22) PCT Filed: Sep. 26, 2019

(86) PCT No.: PCT/CN2019/108098
§ 371 (c)(1),
(2) Date: Jan. 31, 2022

(87) PCT Pub. No.: WO2020/134249
PCT Pub. Date: Jul. 2, 2020

(65) Prior Publication Data
US 2023/0165037 A1      May 25, 2023

(30) Foreign Application Priority Data
Dec. 29, 2018  (CN) .......................... 201811635021.5

(51) Int. Cl.
*H10K 50/84*   (2023.01)
*H10K 50/844*  (2023.01)
(Continued)

(52) U.S. Cl.
CPC ....... *H10K 50/844* (2023.02); *H10K 50/8426* (2023.02); *H10K 59/00* (2023.02); *H10K 59/8731* (2023.02)

(58) Field of Classification Search
CPC ............. H10K 50/844; H10K 50/8445; H10K 50/8426; H10K 59/87; H10K 59/8731; H01L 33/54
See application file for complete search history.

(56) References Cited

U.S. PATENT DOCUMENTS

| 5,872,355 A | 2/1999 | Hueschen |
| 6,692,610 B2 * | 2/2004 | Low .................. H10K 50/8426 156/273.5 |

(Continued)

FOREIGN PATENT DOCUMENTS

| CN | 102299123 A | 12/2011 |
| CN | 102651456 A | 8/2012 |

(Continued)

OTHER PUBLICATIONS

International Search Report for International Application No. PCT/CN2019/108098; International Filing Date: Sep. 26, 2019; Date of Mailing: Dec. 27, 2019; 6 pages, with English Translation.

(Continued)

*Primary Examiner* — Ida M Soward
(74) *Attorney, Agent, or Firm* — CANTOR COLBURN LLP

(57) ABSTRACT

An encapsulated film and a method for encapsulating luminescent device, and a luminescent device, the encapsulated film includes N laminated units, each of the laminated units is composed of barrier layers and surfactant layers which are arranged to be sequentially laminated, the barrier layers and the surfactant layers alternate so that they are adjacent to each other in the encapsulated film, wherein N is an integer greater than or equal to 1. By using the encapsulated film to encapsulate the luminescent device, erosion of water-oxy- (Continued)

gen to a functional layer of the luminescent device can be effectively reduced, and a service life of the luminescent device is improved.

14 Claims, 3 Drawing Sheets

(51) Int. Cl.
  *H10K 50/842* (2023.01)
  *H10K 59/00* (2023.01)
  *H10K 59/80* (2023.01)

(56) References Cited

U.S. PATENT DOCUMENTS

| | | | |
|---|---|---|---|
| 9,685,632 B2 | 6/2017 | Wang et al. | |
| 2002/0025444 A1* | 2/2002 | Hebrink | G02B 5/0841 |
| | | | 428/483 |
| 2002/0038998 A1* | 4/2002 | Fujita | H10K 59/126 |
| | | | 313/495 |
| 2006/0267459 A1* | 11/2006 | Shelby | B32B 27/322 |
| | | | 310/358 |
| 2007/0196682 A1 | 8/2007 | Visser et al. | |
| 2010/0117072 A1* | 5/2010 | Ofuji | H10K 59/123 |
| | | | 257/E29.296 |
| 2014/0141191 A1* | 5/2014 | Lee | H01G 9/2077 |
| | | | 427/407.1 |
| 2014/0252342 A1* | 9/2014 | Ramadas | C23C 28/42 |
| | | | 356/415 |
| 2014/0252406 A1* | 9/2014 | Baisl | H10K 50/844 |
| | | | 438/26 |
| 2015/0349290 A1* | 12/2015 | Iwase | B32B 7/12 |
| | | | 428/212 |
| 2017/0040572 A1* | 2/2017 | Gao | H10K 50/8445 |
| 2019/0393446 A1* | 12/2019 | Mochizuki | C23C 16/345 |

FOREIGN PATENT DOCUMENTS

| | | |
|---|---|---|
| CN | 104377314 A | 2/2015 |
| CN | 106024834 A | 10/2016 |
| CN | 108461642 A | 8/2018 |
| TW | 200845314 A | 11/2008 |
| WO | 2020134249 A1 | 2/2020 |

OTHER PUBLICATIONS

Written Opinion for International Application No. PCT/CN2019/108098; International Filing Date: Sep. 26, 2019; Date of Mailing: Dec. 27, 2019; 3 pages.

* cited by examiner

ENCAPSULATED FILM AND LUMINESCENT DEVICE INCLUDING LAMINATED BARRIER AND SURFACTANT LAYERS

CROSS-REFERENCE TO RELATED APPLICATION

This application is a national phase entry of International Application No. PCT/CN2019/108098, filed on Sep. 26, 2019, which is based upon and claims priority to Chinese Patent Application No. 201811635021.5, filed on Dec. 29, 2018, the entire contents each of which are incorporated herein by reference.

TECHNICAL FIELD

The present disclosure relates to the technical field of luminescence, and particularly to an encapsulated film and a method for encapsulating luminescent device, and a luminescent device.

BACKGROUND

Electroluminescent devices are semiconductor luminescent devices based on organic or inorganic materials and are considered as the next generation luminescence and display devices due to their advantages of spontaneous light, wide viewing angle, high contrast, low power consumption, fast response speed, energy conservation and environmental protection.

Since rapid aging of materials of the functional layers in the structures of the electroluminescent devices is prone to age rapidly due to permeation of water-oxygen and the like, these electroluminescent devices need to be effectively encapsulated to prolong a service life in practical application. Currently, in thin film encapsulation technology, inorganic materials such as $Al_2O_3$, $SiO_x$, $SiN_x$ are disposed on a surface of a metal top electrode by a method such as magnetic sputtering or vacuum deposition, this device is isolated from the external environment to achieve an encapsulation purpose. Although these inorganic materials exhibit excellent water-oxygen isolation properties, hole/linear defects may still occur on the surfaces of the deposited materials, the reliability of device encapsulation is affected.

Thus, improvement is needed in the related art.

SUMMARY

The embodiments of the present disclosure aims to provide an encapsulated film and a method for encapsulating a luminescent device and a luminescent device, which aims to solve the technical problem that an encapsulated film on the existing luminescent device is prone to have hole/linear defects which influence the reliability of encapsulating device.

In order to solve this technical problem, the technical solutions to be adopted by the embodiments of the present disclosure are described as follows:

In one aspect, an encapsulated film is provided, the encapsulated film comprises N laminated units, each of the laminated units is composed of sequentially laminated barrier layers and surfactant layers, the barrier layers and the surfactant layers alternate so that they are adjacent to each other in the encapsulated film; wherein N is an integer greater than or equal to 1.

In one embodiment, the encapsulated film comprises 1-10 laminated units.

In one embodiment, the material of the barrier layer is selected from at least one of a transition metal and a transition metal oxide.

In one embodiment, the transition metal is selected from at least one in a group consisting of Al, Ta, Nb, Ti, Zr, and Hf; and/or, the transition metal oxide is selected from at least one in a group consisting of $Al_2O_3$, $Ta_2O_5$, $Nb_2O_5$, $TiO_2$, $ZrO_2$, and $HfO_2$.

In one embodiment, a material of the surfactant layer is selected from at least one of alkyl phosphate ester and alkyl phosphate ester salt.

In one embodiment, the alkyl phosphate ester is selected from at least one in a group consisting of monododecyl phosphate ester, monotetradecyl phosphate ester, monohexadecyl phosphate ester, monoctadecyl phosphate ester; and/or, the alkyl phosphate ester salt is selected from at least one of alkyl phosphate ester salt and alkyl phosphate ester ester ammonium salt that contain the transition metal.

In one embodiment, a surface of a surfactant layer which is in a Nth laminated unit of the encapsulated film and is away from the barrier layer is provided with a cured adhesive layer.

In one embodiment, a material of the cured adhesive layer is selected from at least one in a group consisting of a photo-curing adhesive, a heat curing adhesive and an anaerobic curing adhesive; and/or, the cured adhesive layer has a thickness ranging from 500 nm to 50 mm.

In one embodiment, when N=1, the barrier layer has a thickness ranging from 10 nm to 4 mm; when N is between 2 and 10, each barrier layer has a thickness of 10-100 nm.

In one embodiment, each of the surfactant layers comprises 1-10 surfactant monomolecular layer(s).

In a second aspect, a method for encapsulating a luminescent device is provided, this method includes the following steps:

providing a luminescent device;

preparing a barrier layer on a top electrode of the luminescent device, preparing a surfactant layer on the barrier layer, wherein a laminated unit is composed of the barrier layer and the surfactant layer; and repeatedly performing a step of preparing the laminated unit to form N laminated units on the top electrode of the luminescent device, wherein N is an integer greater than or equal to 1.

In one embodiment, a step of preparing a cured adhesive layer on surfactant layers of the N laminated units is further included after the step of forming the N laminated units on the top electrode of the luminescent device.

In one embodiment, the step of preparing the surfactant layer on the barrier layer includes: coating an alkyl phosphate ester solution or an alkyl phosphate ester salt solution on a surface of the barrier layer, and removing a solvent to obtain the surfactant layer.

In one embodiment, the step of preparing a barrier layer on the top electrode of the luminescent device includes: depositing at least one of a transition metal and a transition metal oxide on the top electrode to obtain the barrier layer.

In a third aspect, a luminescent device is provided, this luminescent device includes a bottom electrode, a top electrode, and a luminescent layer between the bottom electrode and the top electrode, the top electrode is provided with an encapsulated film which includes N laminated units, each of the laminated units is composed of sequentially laminated barrier layers and surfactant layers, wherein the barrier layers and the surfactant layers alternate so that they are adjacent to each other in the encapsulated film, and a barrier layer in a first laminated unit is adjacent to the top electrode; wherein N is an integer greater than or equal to 1.

In one embodiment, the encapsulated film comprises 1-10 laminated units; and/or, a material of the barrier layer is selected from at least one of a transition metal and a transition metal oxide; and/or, a material of the surfactant layer is selected from at least one of an alkyl phosphate ester and an alkyl phosphate ester salt.

In one embodiment, when N=1, the barrier layer has a thickness ranging from 10 nm to 4 mm; when N is between 2 and 10, each of the barrier layers has a thickness of 10-100 nm; and/or, each of the surfactant layers includes 1-10 surfactant monomolecular layer(s).

In one embodiment, a surface of a surfactant layer which is in a Nth laminated unit of the encapsulated film and is away from the barrier layer is provided with a cured adhesive layer.

In one embodiment, the cured adhesive layer is arranged to be laminated with the Nth laminated unit, or the cured adhesive layer covers the top electrode and a quantum dot luminescent layer and extends to an edge of the bottom electrode.

In one embodiment, a material of the cured adhesive layer is selected from at least one in a group consisting of a photo-curing adhesive, a heat curing adhesive and an anaerobic curing adhesive; and/or the cured adhesive layer has a thickness ranging from 500 nm to 50 mm.

The encapsulated film provided by the embodiment of the present disclosure has the advantageous effects that, the barrier layer in the encapsulated film is configured to block water-oxygen in the environment from penetrating into the luminescent device, meanwhile, the surfactant in the surfactant layer contains a hydrophilic group and a hydrophobic group, the hydrophilic group of the surfactant can be combined with the barrier layer to avoid diffusion of hole or linear defect of the barrier layer, and the hydrophobic group of the surfactant enables the surfactant layer to exhibit good hydrophobicity and affiliate with other organic materials (e.g., curing glue), the surfactant layer can further effectively block water on the basis of the barrier layer of the encapsulated film for blocking water-oxygen, the encapsulated film is used to encapsulate luminescent device, so that the erosion of water-oxygen to the functional layer of the luminescent device can be effectively reduced, and the service life of the luminescent device can be significantly improved.

The method for encapsulating luminescent device provided by the embodiment of the present disclosure has the advantageous effects that, an encapsulated film is prepared on the top electrode of the luminescent device, this encapsulated film is a composite encapsulated film with N laminated units, wherein each laminated unit is composed of sequentially laminated barrier layers and surfactant layers, in this encapsulated film, the surfactant layer can further effectively block water on the basis of the barrier layer for blocking water-oxygen, this method for encapsulating luminescent device can effectively reduce the erosion of water-oxygen to the functional layer of the luminescent device, and significantly improve the service life of the luminescent device.

The luminescent device provided by the embodiment of the present disclosure has the advantageous effects that the unique encapsulated film in the embodiments of the present disclosure is encapsulated on the top electrode of the luminescent device. This encapsulated film can effectively reduce the erosion of water-oxygen to the functional layer of the luminescent device and significantly improve the service life of the luminescent device.

BRIEF DESCRIPTION OF THE DRAWINGS

In order to describe the embodiments of the present disclosure more clearly, a brief introduction regarding the accompanying drawings that need to be used for describing the embodiments of the present disclosure or the prior art is given below; it is apparent that the accompanying drawings described as follows are merely some embodiments of the present disclosure, the person of ordinary skill in the art may also acquire other drawings according to the current drawings on the premise of paying no creative labor.

EMBODIMENTS OF THE PRESENT DISCLOSURE

In order to make the purpose, the technical solutions and the advantages of the present disclosure be clearer and more understandable, the present disclosure is further described in detail below with reference to accompanying figures and embodiments. It should be understood that the specific embodiments described herein are merely intended to illustrate but not to limit the present disclosure.

Figure 1:
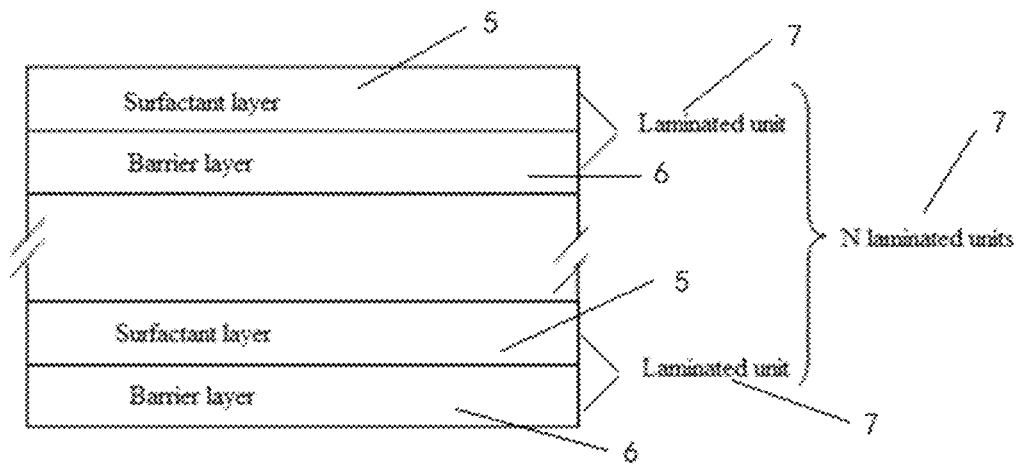
FIG. 1 illustrates a schematic structural diagram of an encapsulated film according to one embodiment of the present disclosure.

An encapsulated film is provided in some embodiments of the present disclosure, as shown in FIG. 1, the encapsulated film includes N laminated units, each of the laminated units is composed of sequentially laminated barrier layers and surfactant layers, the barrier layers and the surfactant layers alternate so that they are adjacent to each other, wherein N is an integer greater than or equal to 1.

The encapsulated film provided by the embodiments of the present disclosure is a composite encapsulated film for encapsulating multi-layer structure of the luminescent device. The encapsulated film includes N laminated units, wherein each of the laminated units is composed of sequentially laminated barrier layers and surfactant layers, each barrier layer in the encapsulated film is configured to block water-oxygen in the environment from penetrating into the device; meanwhile, a surfactant in each surfactant layer contains a hydrophilic group and a hydrophobic group;

wherein the hydrophilic group of the surfactant can be combined with the barrier layer, so that an occurrence of diffusion of hole or linear defect of the barrier layer is avoided, and the hydrophobic group of the surfactant enables the surfactant layer to exhibit good hydrophobicity and affiliate with other organic materials (e.g., curing glue), thus, the surfactant layer can further effectively block water on the basis of the barrier layer of the encapsulated film for blocking water-oxygen, the erosion of the water-oxygen to the functional layer of the luminescent device can be effectively reduced by using the encapsulated film to encapsulate the luminescent device, and the service life of the luminescent device can be significantly improved.

In one embodiment, N is between 1 and 10, that is, the encapsulated film includes 1-10 laminated unit(s), that is, in this embodiment of the present disclosure, the encapsulated film includes sequentially laminated barrier layers and surfactant layers; or the encapsulated film includes a first barrier layer, a first surfactant layer, a second barrier layer, and a second surfactant layer which are sequentially laminated; or the encapsulated film includes a first barrier layer, a first surfactant layer, a second barrier layer, a second surfactant layer, a third barrier layer, and a third surfactant layer which are sequentially laminated, etc., an encapsulated film including 1-10 laminated unit(s) can be formed.

Figure 2:
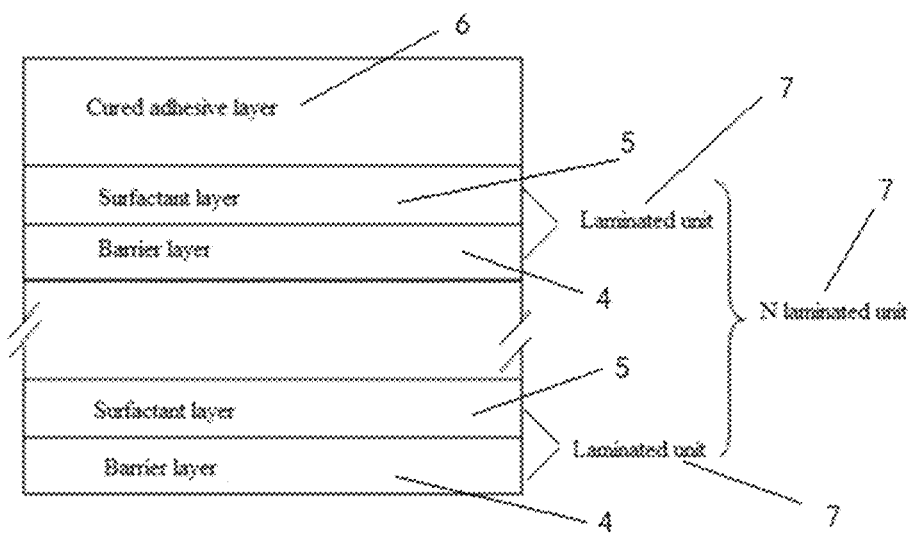
FIG. 2 illustrates a schematic structural diagram of another encapsulated film according to one embodiment of the present disclosure.

In one embodiment, as shown in FIG. 2, a surface of the surfactant layer which is in the Nth laminated unit of the encapsulated film and is away from the surface of the barrier layer is provided with a cured adhesive layer. The encapsulated film is configured to encapsulate the luminescent device, a barrier layer in the first laminated unit is adjacent to the top electrode, by providing a cured adhesive layer on the surface of the surfactant layer in the Nth laminated unit, such that the cured adhesive layer can affiliate with the hydrophobic group in the surfactant, and the sealing performance of the device is further improved; thus, the surfactant layer further effectively blocks water on the basis of the water-oxygen barrier layer of the encapsulated film for blocking water-oxygen, and an organic encapsulation treatment is further performed on the surfactant layer through the cured adhesive layer, so that the path through which water-oxygen penetrates into the device is finally prolonged, and the service life of the luminescent device can be further prolonged. The material of the cured adhesive layer is selected from at least one of a photo-curing adhesive, a heat curing adhesive, and an anaerobic curing adhesive.

When the encapsulated film only includes one laminated unit, the barrier layer has a thickness ranging from 10 nm to 4 mm; when the encapsulated film includes 2-10 laminated units, in order to avoid an encapsulated film with too thick thickness, each of the barrier layers has a thickness of 10-100 nm, regardless the number of surfactant layers, each of the surfactant layers can include 1-10 surfactant monomolecular layer(s); and the cured adhesive layer has a thickness ranging from 500 nm to 50 mm, preferably ranging from 500 nm to 20 mm, and more preferably ranging from 1-10 mm, not only light transparency of the encapsulated film is ensured in this range of thickness, a water-oxygen isolation performance is also considered.

In one embodiment, the material of the barrier layer is selected from at least one of a transition metal and a transition metal oxide; in particular, the transition metal is selected from at least one in a group consisting of Al, Ta, Nb, Ti, Zr, and Hf, the transition metal oxide is selected from at least one in a group consisting of $Al_2O_3$, $Ta_2O_5$, $Nb_2O_5$, $TiO_2$, $ZrO_2$, and $HfO_2$; the material of the surfactant layer is selected from at least one of alkyl phosphate ester and alkyl phosphate ester salt; in particular, the alkyl phosphate ester is the one selected from monododecyl phosphate ester, monotetradecyl phosphate ester, monohexadecyl phosphate ester, monoctadecyl phosphate ester; the alkyl phosphate ester salt is selected from at least one of alkyl phosphate ester salt and alkyl phosphate ester ester ammonium salt that contain the transition metal.

The alkyl phosphate ester/the alkyl phosphate ester salt serves as ampholytic surfactant, and can form self-assembled monomolecular film on the surface of the metal or metal oxide, in particular, the alkyl phosphate ester/the alkyl phosphate ester salt can form a stable M-O—P bond (i.e., M is the transition metal) on the surface of the transition metal or the transition metal oxide, this stable M-O—P bond has a deactivation effect on the surface of the transition metal or the transition metal oxide, and has a further water-oxygen barrier effect on the barrier layer composed of the transition metal or the transition metal oxide.

Figure 3:
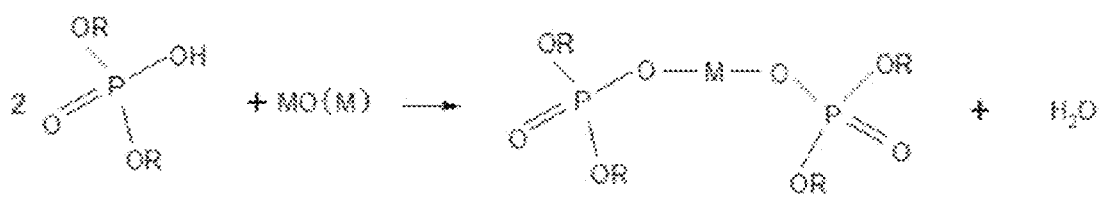
FIG. 3 illustrates a reaction process between a surfactant layer generated by an alkyl phosphate ester or an alkyl phosphate salt and a stable M—O—P bond generated by a transition metal or a transition metal oxide in the barrier layer according to one embodiment of the present disclosure.

The surfactant layer formed by the alkyl phosphate ester or the alkyl phosphate ester salt reacts with the transition metal or the transition metal oxide in the barrier layer so as to form the stable M-O—P bond, the reaction process is shown in FIG. 3.

Figure 4:
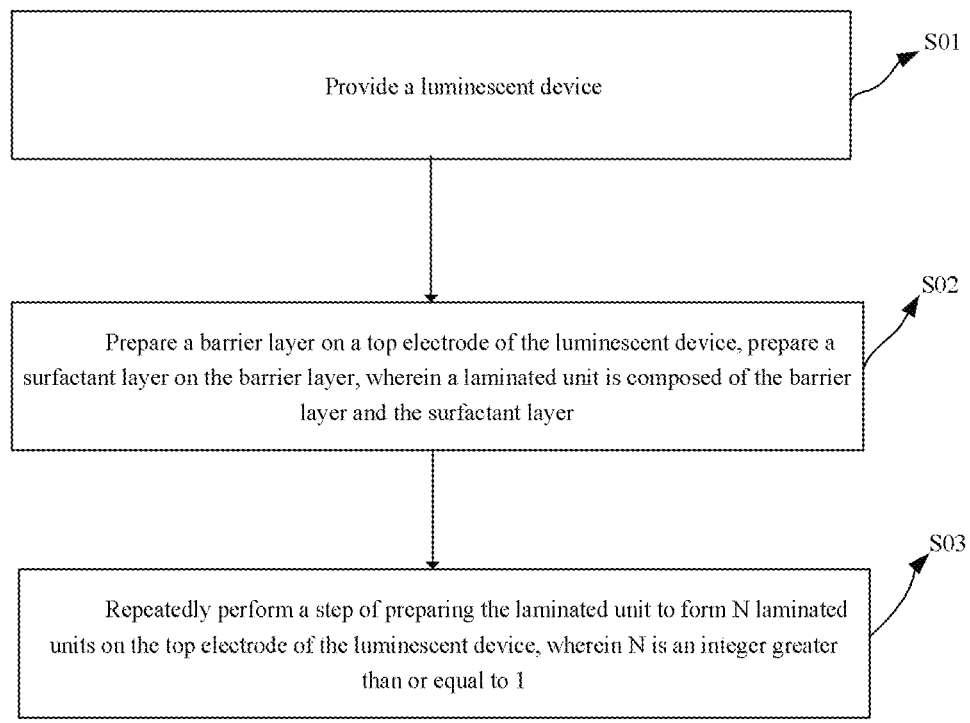
FIG. 4 illustrates a flowchart of a method for encapsulating a luminescent device according to one embodiment of the present disclosure.

In another aspect, one embodiment of the present disclosure further provides a method for encapsulating a luminescent device, as shown in FIG. 4, this method includes the following steps:

in a step of S01, providing the luminescent device;

in a step of S02, preparing a barrier layer on a top electrode of the luminescent device, and preparing a surfactant layer on the barrier layer, wherein a laminated unit is composed of the barrier layer and the surfactant layer;

in a step of S03, repeatedly performing the step of preparing the laminated unit to form N laminated units on the top electrode of the luminescent device; wherein N is an integer greater than or equal to 1.

In this method for encapsulating the luminescent device provided by the embodiment of the present disclosure, the encapsulated film is prepared on the top electrode of the luminescent device, this encapsulated film is a composite encapsulated film having N laminated units, wherein each of the laminated units is composed of sequentially laminated barrier layers and surfactant layers, in this encapsulated film, the surfactant layer can further effectively block water on the basis of the barrier layer for blocking water-oxygen, this method for encapsulating luminescent device can effectively reduce the erosion of water-oxygen to the functional layer of the luminescent device, and therefore significantly improve the service life of the luminescent device.

In one embodiment, the step of preparing the surfactant layer on the barrier layer includes: coating an alkyl phosphate ester solution or an alkyl phosphate ester salt solution on the surface of the barrier layer, and removing the solvent to obtain the surfactant layer. There are various methods for removing the solvent, these methods can be such as naturally air-dried, and can also be vacuum-dried. In the embodiment of the present disclosure, standing drying is adopted, specifically, a standing time is between 1 hours and 100 hours; more specifically, the alkyl phosphate ester solution or the alkyl phosphate ester salt solution is coated on the surface of the barrier layer, solvent cleaning and drying steps are further included after standing treatment. Specifically, the alkyl phosphate ester is at least one of a monododecyl phosphate ester, a monotetradecyl phosphate ester, a monohexadecyl phosphate ester, and a monooctadecyl phosphate ester; the alkyl phosphate ester salt is selected from at least one of an alkyl phosphate ester salt and an alkyl phosphate ester salt which contain the transition metal.

In one embodiment, the step of preparing a barrier layer on the top electrode of the luminescent device includes: depositing at least one material of the transition metal and the transition metal oxide on the top electrode to obtain the barrier layer. In particular, the transition metal is selected from at least one in a group consisting of Al, Ta, Nb, Ti, Zr, and Hf, the transition metal oxide is selected from at least one in a group consisting of $Al_2O_3$, $Ta_2O_5$, $Nb_2O_5$, $TiO_2$, $ZrO_2$, and $HfO_2$.

In one embodiment, after the step of forming N laminated units on the top electrode of the luminescent device, the step of preparing the cured adhesive layer on the surfactant layer in the N laminated units is further included. The prepared cured adhesive layer can affiliate with the hydrophobic group in the surfactant, thereby further improves the sealing property of the device; thus, in this encapsulated film, the surfactant layer further blocks water effectively on the basis of the barrier layer for blocking water-oxygen, an organic encapsulation treatment is further performed on the surfactant layer through the cured adhesive layer, and the path through which water-oxygen penetrates into the device is finally prolonged, and the service life of the luminescent device can be further prolonged.

In one embodiment of the present disclosure, a method for encapsulating electroluminescent device is provided, this method includes the following steps:

1) preparing a functional layer and a cathode on an anode substrate to obtain a luminescent device;

2) preparing a barrier layer on a cathode by magnetron sputtering or vacuum evaporation;

3) coating the alkyl phosphate ester solution or the alkyl phosphate ester salt solution on the barrier layer, keeping the surface of the barrier layer wet by the solution, self-assembly time is between 1 hour and 100 hours, washing the surface of the barrier layer with the solvent after self-assembly, and removing the solvent to prepare the molecular film layer by drying method;

wherein the alkyl phosphate ester solution or alkyl phosphate ester salt solution is an alcohol organic solvent such as ethanol, isopropanol, etc.; the drying method includes natural air-drying or vacuum drying.

4) coating a cured glue on the barrier layer, the molecular film layer and the edge of the anode substrate, performing sealant encapsulation, sealing the functional layer and the cathode after curing, or depositing a layer of curing adhesive on the molecular film by solution method, and encapsulating the functional layer and the cathode after curing.

The aforesaid encapsulation method implemented in the present disclosure is suitable for encapsulating rigid substrate or flexible substrate, the encapsulation material is cheap, mass production is easy.

Finally, one embodiment of the present disclosure further provide a luminescent device which includes a bottom electrode, a top electrode and a luminescent layer between the bottom electrode and the top electrode; the top electrode is provided with an encapsulated film; the encapsulated film includes N laminated units; each of the laminated units is composed of sequentially laminated barrier layers and surfactant layers; in the encapsulated film, the barrier layers and the surfactant layers alternate so that they are adjacent to each other, and a barrier layer in the first laminated unit is adjacent to the top electrode; wherein N is an integer greater than or equal to 1.

In the luminescent device provided by this embodiment of the present disclosure, the unique encapsulated film in the embodiments of the present disclosure is encapsulated on the top electrode. The encapsulated film can effectively reduce the erosion of water-oxygen to the functional layer of the luminescent device, and therefore significantly improve the service life of the luminescent device.

In one embodiment, a surface of the surfactant layer which is in the Nth laminated unit of the encapsulated film and is away from the surface of the barrier layer is provided with a cured adhesive layer, wherein the cured adhesive layer is laminated with the Nth laminated unit, or the cured adhesive layer coats the top electrode and the quantum dot luminescent layer and extends to the edge of the bottom electrode. This encapsulated film can finally prolong the path through which the water-oxygen penetrates into the device, by using the encapsulated film to encapsulate the luminescent device, the erosion of the water-oxygen to the functional layer of the luminescent device can be effectively reduced, and the service life of the luminescent device can be significantly improved. The material of the cured adhesive layer is selected from at least one of a photo-curing adhesive, a heat curing adhesive and an anaerobic curing adhesive, and the cured adhesive layer has a thickness ranging from 500 nm to 50 mm.

In one embodiment, in the luminescent device, the encapsulated film comprises 1-10 laminated units; when H=1, the barrier layer has a thickness ranging from 10 nm to 4 mm; when N is between 2 and 10, the thickness of each layer of the barrier layer is between 1 nm and 100 nm. Each of the surfactant layers includes 1-10 surfactant monomolecular layer. Wherein the material of the barrier layer is selected from at least one of transition metal and transition metal oxide; the material of the surfactant layer is selected from at least one of alkyl phosphate ester and alkyl phosphate ester salt.

In one embodiment, the bottom electrode is a conductive rigid substrate or a conductive flexible substrate. The top electrode is anon-transparent metal top electrode (e.g., silver, aluminum, gold, etc.) or a transparent top electrode (e.g., dielectric layer/metal layer/dielectric layer, etc.).

In the present disclosure, many tests have been performed in sequence, the present disclosure is further described in detail with reference to a part of test results, the present disclosure is described in detail below with reference to the specific embodiments.

Example One

Figure 5:
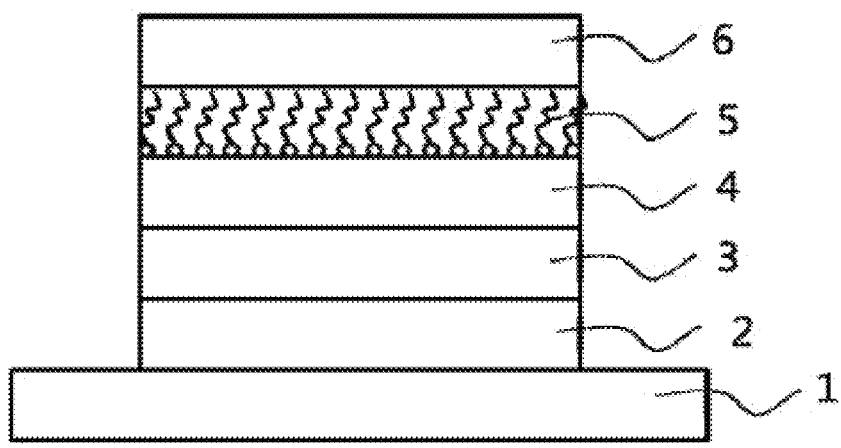
FIG. 5 illustrates a schematic structural diagram of an electroluminescent device according to embodiment one of the present disclosure.

An encapsulation structure of electroluminescent device, as shown in FIG. 5, this electroluminescent device includes an anode substrate 1, a functional layer 2 (which may include a hole transmission layer, a quantum dot luminescent layer, and an electron transmission layer that are laminated from bottom to top), a cathode 3, and an encapsulation layer in sequence from bottom to top. The encapsulation layer includes a barrier layer 4, a surfactant layer 5, and a cured adhesive layer 6 laminated sequentially from bottom to up. The encapsulation layer seals the anode substrate 1, the functional layer 2 and the cathode 3 in an enclosed space. The barrier layer 4 is a $TiO_2$ film with a thickness of 100 nm. The surfactant layer 5 is a monolayer monododecyl phosphate ester molecular film, and the cured adhesive layer 6 is a photo-cured adhesive layer with a thickness of 1 mm.

Example Two

Figure 6:
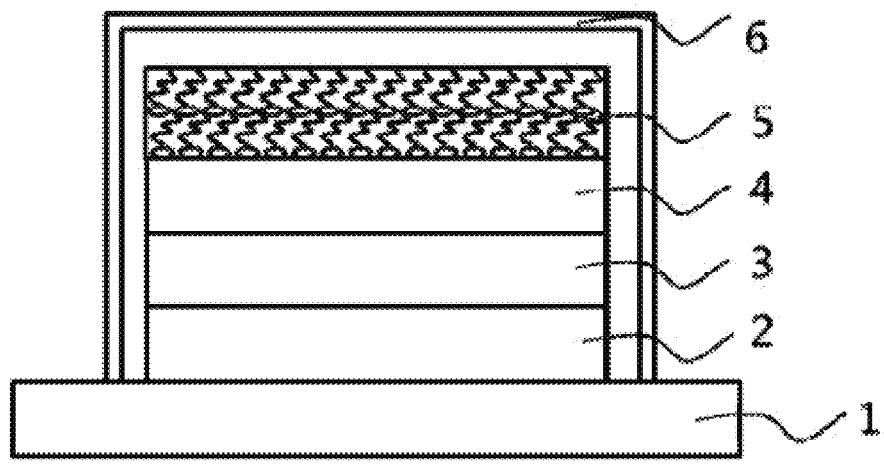
FIG. 6 illustrates a schematic structural diagram of an electroluminescent device according to embodiment two of the present disclosure.

An encapsulation structure of electroluminescent device, as shown in FIG. 6, this electroluminescent device includes an anode substrate 1, a functional layer 2 (which may include a hole transmission layer, a quantum dot luminescent layer, and an electron transmission layer that are laminated from bottom to top), a cathode 3, and an encapsulation layer orderly from bottom to top; the encapsulation layer includes a barrier layer 4, a surfactant layer 5, and the cured adhesive layer 6 is coated on the barrier layer 4, the surfactant layer 5 and an edge of anode substrate 1 with a curing adhesive so as to perform sealant encapsulation, so that the functional layer 2, the cathode 3, the barrier layer 4 and the surfactant layer 5 are sealed in an enclosed space. The barrier layer 4 includes a $SiO_2$ film with a thickness of 50 nm and a $Ta_2O_5$ film with a thickness of 200 nm, the surfactant layer 5 is a double layer octadecyl octodecane phosphate ester molecular film, and the cured adhesive layer 6 is a heat-cured adhesive layer with a thickness of 5 mm.

The foregoing are only selectable embodiments of the present disclosure, and should not be regarded as limitations to the present disclosure. For the person of ordinary skill in the art, various modifications and changes may be made in the present disclosure. Any modification, equivalent replacement, improvement, and the like, which are made within the spirit and the principle of the present disclosure, should all be included in the protection scope of the present disclosure.

What is claimed is:

1. An encapsulated film, wherein the encapsulated film comprises N laminated units, each of the laminated units is composed of sequentially laminated barrier layers and surfactant layers, the barrier layers and the surfactant layers alternate so that they are adjacent to each other in the encapsulated film; wherein N is an integer greater than or equal to 1, wherein a surface of a surfactant layer which is in a Nth laminated unit of the encapsulated film and is away from the barrier layer is provided with a cured adhesive layer.

2. The encapsulated film according to claim 1, wherein N is between 1 and 10.

3. The encapsulated film according to claim 1, wherein the material of the barrier layer is selected from at least one of a transition metal and a transition metal oxide.

4. The encapsulated film according to claim 3, wherein the transition metal is selected from at least one in a group consisting of Al, Ta, Nb, Ti, Zr, and Hf; and/or,
the transition metal oxide is selected from at least one in a group consisting of $Al_2O_3$, $Ta_2O_5$, $Nb_2O_5$, $TiO_2$, $ZrO_2$, and $HfO_2$.

5. The encapsulated film according to claim 1, wherein a material of the surfactant layer is selected from at least one of alkyl phosphate ester and alkyl phosphate ester salt.

6. The encapsulated film according to claim 5, wherein the alkyl phosphate ester is selected from at least one in a group consisting of monododecyl phosphate ester, monotetradecyl phosphate ester, monohexadecyl phosphate ester, monoctadecyl phosphate ester; and/or,
the alkyl phosphate ester salt is selected from at least one of alkyl phosphate ester salt and alkyl phosphate ester ammonium salt that contain a transition metal.

7. The encapsulated film according to claim 1, wherein a material of the cured adhesive layer is selected from at least one in a group consisting of a photo-curing adhesive, a heat curing adhesive and an anaerobic curing adhesive; and/or,
the cured adhesive layer has a thickness ranging from 500 nm to 50 mm.

8. The encapsulated film according to claim 1, wherein when N=1, the barrier layer has a thickness ranging from 10 nm to 4 mm; when N is between 2 and 10, each barrier layer has a thickness of 10-100 nm.

9. The encapsulated film of claim 1, wherein each of the surfactant layers comprises one or a plurality of surfactant monomolecular layer(s), and a number of the surfactant monomolecular layer(s) ranges from 1 to 10.

10. A luminescent device, comprising a bottom electrode, a top electrode, and a luminescent layer between the bottom electrode and the top electrode, wherein the top electrode is provided with an encapsulated film which comprises N laminated units, each of the laminated units is composed of sequentially laminated barrier layers and surfactant layers, wherein the barrier layers and the surfactant layers alternate so that they are adjacenet to each other in the encapsulated film, and a barrier layer in a first laminated unit is adjacent to the top electrode; wherein N is an integer greater than or equal to 1, wherein a surface of a surfactant layer which is in a Nth laminated unit of the encapsulated film and is away from the barrier layer is provided with a cured adhesive layer.

11. The luminescent device according to claim 10, wherein N is between 1 and 10; and/or,
a material of the barrier layer is selected from at least one of a transition metal and a transition metal oxide; and/or,
a material of the surfactant layer is selected from at least one of an alkyl phosphate ester and an alkyl phosphate ester salt.

12. The luminescent device according to claim 10, wherein when N=1, the barrier layer has a thickness ranging from 10nm to 4 mm; when N is between 2 and 10, each of the barrier layers has a thickness of 10-100 nm; and/or,
each of the surfactant layers comprises one or a plurality of surfactant monomolecular layer(s), and a number of the surfactant monomolecular layer(s) ranges from 1 to 10.

13. The luminescent device according to claim 10, wherein the cured adhesive layer is arranged to be laminated with the Nth laminated unit, or the cured adhesive layer covers the top electrode and a quantum dot luminescent layer and extends to an edge of the bottom electrode.

14. The luminescent device according to claim 10, wherein a material of the cured adhesive layer is selected from at least one in a group consisting of a photo-curing adhesive, a heat curing adhesive and an anaerobic curing adhesive;
and/or the cured adhesive layer has a thickness ranging from 500nm to 50 mm.

* * * * *